United States Patent
Walker et al.

(10) Patent No.: US 6,920,188 B1
(45) Date of Patent: Jul. 19, 2005

(54) METHOD AND APPARATUS FOR PROCESSING A MULTIPLE-COMPONENT WIDE DYNAMIC RANGE SIGNAL

(75) Inventors: James Terrell Walker, Palo Alto, CA (US); Kamran Khorram Abadi, Memlo Park, CA (US); Robert Gustav Lorenz, Menlo Park, CA (US)

(73) Assignee: Piradian, Inc., Menlo Park, CA (US)

( * ) Notice: Subject to any disclaimer, the term of this patent is extended or adjusted under 35 U.S.C. 154(b) by 992 days.

(21) Appl. No.: 09/715,395

(22) Filed: Nov. 16, 2000

(51) Int. Cl.$^7$ ................................................ H03D 3/00
(52) U.S. Cl. ...................... 375/322; 381/106; 704/224; 370/202
(58) Field of Search ................................ 375/322, 323, 375/324, 340, 240, 345; 342/204; 381/321, 106; 704/224, 500, 503; 382/232, 233; 370/202

(56) References Cited

U.S. PATENT DOCUMENTS

| | | | |
|---|---|---|---|
| 3,792,246 A | 2/1974 | Gilbreath et al. | 235/186 |
| 4,090,145 A | 5/1978 | Webb | |
| 4,263,560 A | 4/1981 | Ricker | 330/129 |
| 4,577,157 A | 3/1986 | Reed | |
| 4,692,889 A | 9/1987 | McNeely | 364/730 |
| 4,910,465 A | 3/1990 | Dillman | 328/133 |
| 5,001,489 A | 3/1991 | Taylor, Jr. | 342/194 |
| 5,025,471 A * | 6/1991 | Scott et al. | 704/237 |
| 5,134,722 A | 7/1992 | Emslie et al. | |
| 5,159,710 A | 10/1992 | Cusdin | |
| 5,192,956 A * | 3/1993 | Lee | 342/204 |
| 5,521,548 A | 5/1996 | Sugawara | |
| 5,533,064 A | 7/1996 | Ichihara | |
| 5,936,871 A | 8/1999 | Pan et al. | 364/748.5 |
| 6,011,963 A | 1/2000 | Ogoro | |
| 6,072,885 A * | 6/2000 | Stockham et al. | 381/321 |
| 6,298,356 B1 | 10/2001 | Jawahar et al. | |

FOREIGN PATENT DOCUMENTS

JP         354043651 A  *  4/1979

* cited by examiner

*Primary Examiner*—Don N. Vo
(74) *Attorney, Agent, or Firm*—Townsend and Townsend and Crew LLP

(57) ABSTRACT

An apparatus is provided for processing a wide dynamic range analog signal which comprises multiple components such as a signal with an in-phase component and a quadrature-phase component in for example separate I and Q data channels, wherein each channel has a dynamic range compressor stage and an operator stage which processes the compressed signals. Optionally the apparatus has a dynamic range expander stage following the operator stage. A method according to the invention involves processing I and Q information after first independently compressing the dynamic range of the signal according to a logarithmic transfer characteristic over a frequency range of interest. A mathematical operation through a F(i,q) function (corresponding to the operator stage) is performed on the compressed components, thereby producing normalized components. The operating transfer function F(i,q) cross links the data channels to effect normalization based on amplitude of information in each of the channels. Dynamic range expansion provides expanded components in an expanded domain. The invention is applicable to any analog signal system having a plurality of channels carrying related signal information.

62 Claims, 5 Drawing Sheets

METHOD AND APPARATUS FOR PROCESSING A MULTIPLE-COMPONENT WIDE DYNAMIC RANGE SIGNAL

BACKGROUND OF THE INVENTION

This invention relates to processing analog signals in a manner which accommodates a wide dynamic range of signal amplitude. In particular, the invention relates to processing signals in two or more channels which convey related information. A particular application is in the processing of complex number based signals in the form of in-phase and quadrature-phase components.

Radio and other wireless receivers must accommodate a wide range of signal levels. This wide dynamic range involves many factors such as path loss and variation in receiver gain. Automatic gain control (AGC) circuits have conventionally been employed for automatically controlling the gain of the receiver to narrow the dynamic range within the receiver. Typically, these gain control circuits employed feedback circuitry which slowed the gain control operation. Input signal level changes caused gain changes through a feedback loop, which required time to damp out. Each current output value was affected by the preceding values. The feedback loop introduced delay in the response which caused a transient in the desired output.

In U.S. Pat. No. 4,263,560, entitled "LOG-EXPONENTIAL AGC CIRCUIT," of Ricker, FIGS. 1 and 3 show prior art implementations of feedback-based AGC circuits.

Logarithmic amplifiers are well known and described in detail in the books by Richard Smith Hughes entitled *Logarithmic Amplification* and *Logarithmic Video Amplifiers,* which are cited here for general background in the field.

A circuit used to compute the angle of complex signal comprising in-phase (I) and quadrature-phase (Q) components using logarithms of these I and Q components is described in U.S. Pat. No. 3,792,246, entitled "VECTOR ANGLE COMPUTER," of Gilbreath et al. In this patent, a single circuit is disclosed which can be used to generate the logarithmic transfer characteristic, with the further ability to compute the difference of logs.

A phase detector which takes as inputs logarithms of input I and Q signals is described in U.S. Pat. No. 5,001,489, entitled "DIGITAL PHASE DETECTOR," of Taylor, Jr. In this system, the input digital signals are logarithms of the square of in-phase and quadrature-phase components of a signal and are subtracted in the phase detector to produce a signal having a magnitude and a polarity. The polarities of the difference signals and of the two information signals are used to determine the octant of the phase angle by addressing a table found in a read only memory. Similarly, the magnitude of the difference signal is used as an address of a read only memory storing digital values corresponding to angles within an octant. Use of a pre-computed memory element is an integral part of this patent to avoid the requirement of "extremely fast processors or specially constructed arithmetic processors for performing calculations in hardware."

In U.S. Pat. No. 4,692,889, entitled "CIRCUITRY FOR CALCULATING MAGNITUDE OF VECTOR SUM FROM ITS ORTHOGONAL COMPONENTS IN DIGITAL TELEVISION RECEIVER," inventor McNeely describes a circuit which calculates the magnitude of a vector from its orthogonal components. Its relevance is to the definition of a norm of a signal.

Dillman, U.S. Pat. No. 4,910,465, entitled "PHASE DETECTOR," describes a similar circuit in which the logarithmic transfer function is applied to signals which have been previously digitized.

Pan et al., in U.S. Pat. No. 5,936,871, entitled "METHOD AND SYSTEM FOR PERFORMING L2 NORM OPERATION," describes a numerical method for computing the distance between two vectors. The system of Pan, et al. describes and claims a system whose topology includes data pipelines, an inverse-logarithm converter, and an accumulator. The signals presented to the digital circuit do not correspond to the logarithms of signal. The Pan et al. system employs a feedback stage.

What is needed is a circuit capable of accommodating a large dynamic range signal without the limitations attendant with feedback and AGC circuits.

SUMMARY OF THE INVENTION

According to the invention, an apparatus is provided for processing a wide dynamic range analog signal which comprises multiple components such as a signal with an in-phase component and a quadrature-phase component in for example separate I and Q data channels, wherein each channel has a dynamic range compressor stage and an operator stage which processes the compressed signals. Optionally the apparatus has a dynamic range expander stage following the operator stage. A method according to the invention involves processing I and Q information after first independently compressing the dynamic range of the signal according to a logarithmic transfer characteristic over a frequency range of interest. A mathematical operation through a F(i,q) function (corresponding to the operator stage) is performed on the compressed components, thereby producing normalized components. The operating transfer function F(i,q) cross links the data channels to enforce normalization based on amplitude of information in each of the channels. Other normalization criteria may also be used, such as polyhedral normalization. Dynamic range expansion provides expanded components in an expanded domain. The invention is applicable to any analog signal system having a plurality of channels carrying signal information which may or may not be related to signals in other channels.

One of the features of the invention is a signal processing method and apparatus having a timely and accurate response to input signal amplitude changes. The use of a normalizing function between parallel data channels effects a timely and accurate response. The normalizing function provides feed-forward interaction between the channels, which permits nearly instantaneous responses to amplitude changes. Specifically, the system is capable of providing nearly instantaneously information based on input phase and amplitude relationships.

The normalizing function according to the invention is memoryless and feedback loops are not employed. The difference in the amplitudes between the two channels is used for processing and correcting the signal.

The method and apparatus according to the invention does not introduce response delays during operation, since the typical source of the delays, the settling time of the feedback loop from a subsequent stage to a preceding stage, is eliminated.

In the present system, separate nonlinear characteristics, nominally logarithmic, are used to process the I and Q components. No pre-computed memory element is required to perform calculations, since the method is already inherently fast.

A significant difference between methods of the prior art as represented by the McNeely patent and the present invention is that in McNeely the signals passed through the circuit having a logarithmic response are digital, whereas in the current invention signals are advantageously passed as analog signals through circuits having logarithmic responses.

BRIEF DESCRIPTION OF THE DRAWINGS

The invention will be more fully understood by reference to following detailed description and drawings in which.

Figure 1:
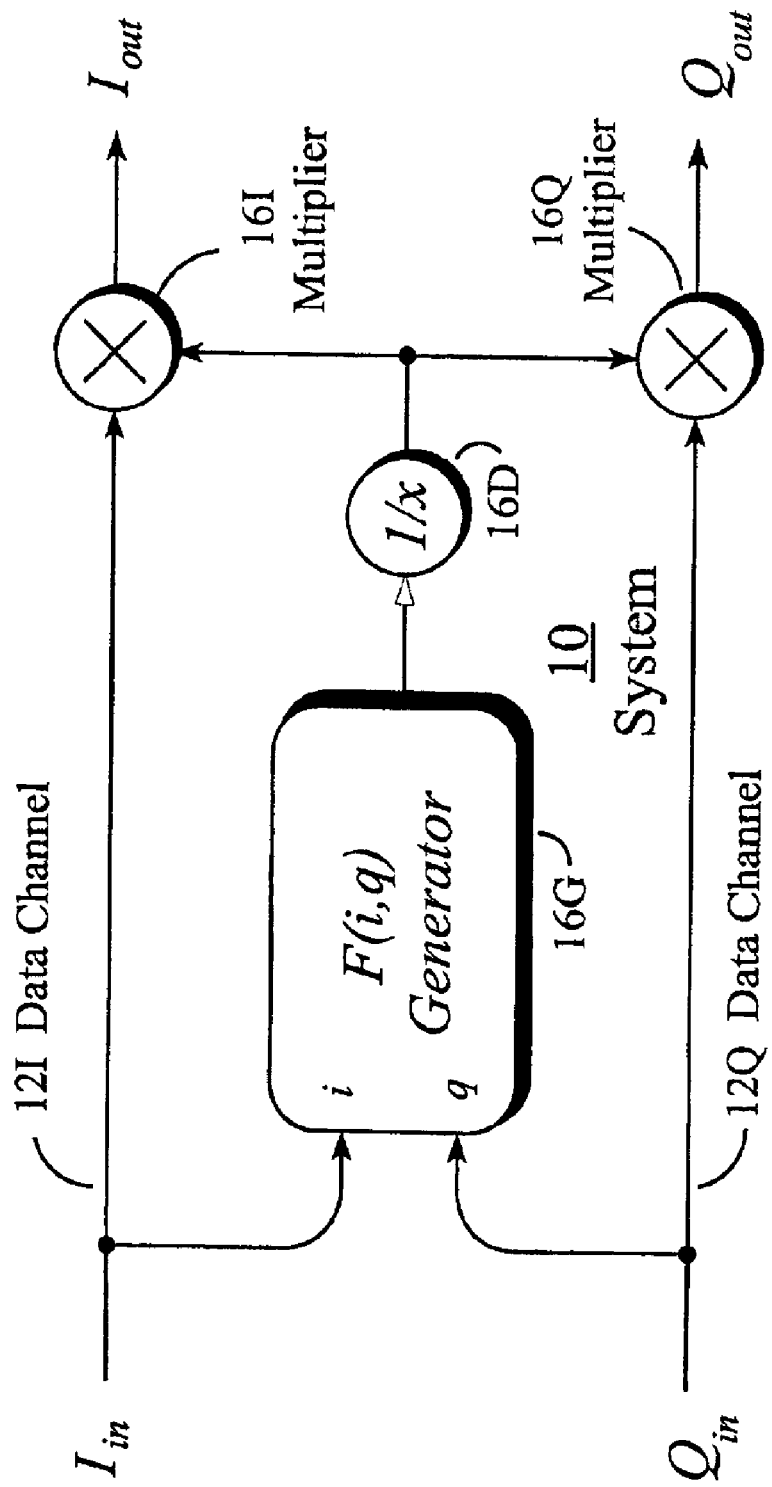
FIG. 1 is a block diagram of a generalized system according to the invention for processing in-phase (I) components and quadrature-phase (Q) components containing phase and amplitude based information.

(The first digit of each reference numeral in the above figures indicates the figure in which an element or feature is most prominently shown. The second digit indicates related elements or features, and a final letter (when used) indicates a sub-portion of an element or feature.)

REFERENCE NUMERALS IN DRAWINGS

The table below lists the reference numerals employed in the figures, and identifies the element designated by each numeral.

10 System 10
12I Data Channel 12I
12Q Data Channel 12Q
16D Inverse Transfer Circuit 16D
16G F(i,q) Generator 16G
16I Multiplier 16I
16Q Multiplier 16Q
20 General System 20
22I Data Channel 22I
22Q Data Channel 22Q
22A Input Antenna 22A
22C Data Cable Feed 22C
22S Data Storage Device 22S
24I Dynamic Range Compressor 24I
24Q Dynamic Range Compressor 24Q
26 Operator Stage 26
26G F(i,q) Function Generator 26G
26I Channel Operator 26I
26Q Channel Operator 26Q
26IQ F(i,q) Filter 26IQ
28I Dynamic Range Expander 28I
28Q Dynamic Range Expander 28Q
29I Expanded Domain Filter 29I
29Q Expanded Domain Filter 29Q
30 Logarithm Based System 30
32I Data Channel 32I
32Q Data Channel 32Q
34I Logarithmic Compressor 34I
34Q Logarithmic Compressor 34Q
35I Compressed Domain Filters 35I
35Q Compressed Domain Filters 35Q
36 Normalizer Stage 36
36G Fn(i,q) Normalizer Function Generator 36G
36I Polarity Sensitive Subtractor 36I
36Q Polarity Sensitive Subtractor 36Q
36IQ F(i,q) Filter 36IQ
38I Antilogarithmic Expanders 38I
38Q Antilogarithmic Expanders 38Q
50 System 50
52I Data Channel 52I
52Q Data Channel 52Q
54I Inverse Hyperbolic Sine Transfer Circuit 54I
54Q Inverse Hyperbolic Sine Transfer Circuit 54Q
56D Inverse Hyperbolic Sine Transfer Circuit 56D
56G F(i,q) Generator 56G
56I Polarity Sensitive Summer 56I
56IQ Filter 56IQ
56Q Polarity Sensitive Summer 56Q
58I Hyperbolic Sine Transfer Circuit 58I
58Q Hyperbolic Sine Transfer Circuit 58Q

DESCRIPTION OF THE SPECIFIC EMBODIMENTS

The following description of the invention focuses on an embodiment employing two channels of analog information related by phase and amplitude, which has a common communication application. However, it is to be understood that the invention may be generalized to a system of more than two channels. It is to be further understood that the analog basis of the signal information may be processed in a digital domain, so long as the signal processing functions called for in the invention are preserved.

General Embodiment—Block Diagram (FIG. 1)

The p-norm of a vector, or as herein called the vector norm, is given by the following relationship:

$$\|x\|_p = \left(\sum_{i=1}^{n} |x_i|^p\right)^{1/p} \quad (1)$$

where n is the number of inputs. In FIG. 1, a system 10 according to the invention includes an I data channel 12I and a Q data channel 12Q, each connected to a separate multiplier 16I, 16Q and a function generator 16G which calculates the vector p-norm of the vector consisting of the I and Q components. The system 10 is operative on linear or uncompressed signals. According to the invention, this value for the magnitude of x must be constant for all systems of interest. Other vector norms corresponding to other measures of distance can also be used without departing from the spirit and scope of this invention. An example of such a vector norm is the polyhedral norm of a vector.

The above general relationship becomes the specific relationship for two synchronously-related inputs i and q in a Function Generator 16G, which calculates the p-norm value:

$$F(i, q) = (|i|^p + |q|^p)^{1/p}. \tag{2}$$

A suitable approximation of the p-norm may be employed to reduce fabrication costs, code space, and computational time or to increase processing speed without undue loss of processing accuracy. Such approximations in functions involve a known or intentionally-introduced deviation from the true function wherein the deviation is insignificant compared to the desired signal. The output of the F(i,q) Generator 16G is inverted by inverse transfer circuit 16D and applied to the second inputs of multipliers 16I and 16Q. The output of the multipliers 16I and 16Q are Iout and Qout for the normalized I and Q outputs respectively. It is easily seen that the Iout and Qout, taken together, have constant vector p-norm. This system is useful in processing signals with constant envelope or amplitude; however, it is less useful for processing of signals which have signal constellations whose points are not equidistant from the origin, such as signals with amplitude modulation.

Figure 2:
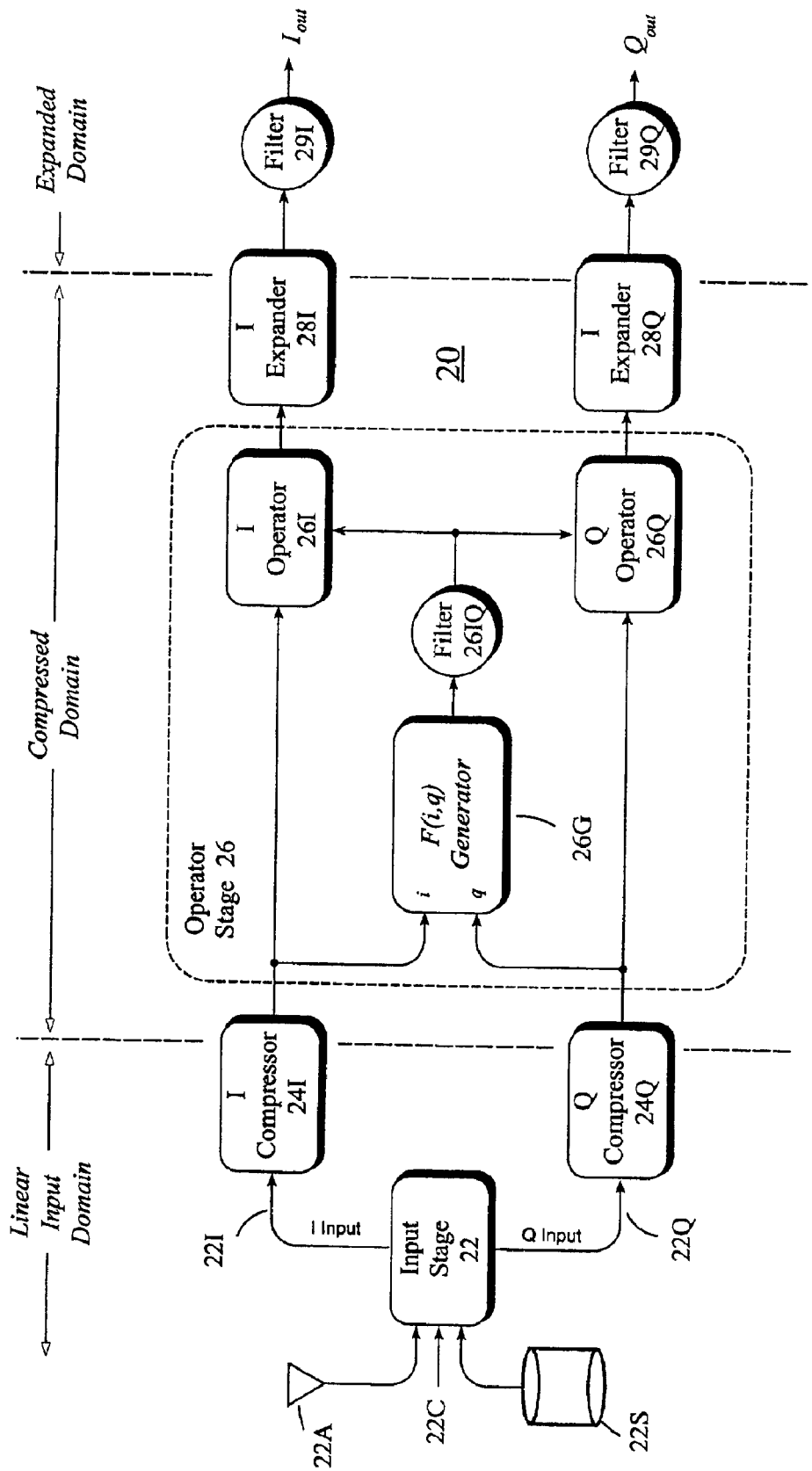
FIG. 2 is a block diagram of one embodiment of a system according to the invention for processing in-phase (I) components and quadrature-phase (Q) components containing phase and amplitude based information.

Referring now to FIG. 2, system 20 includes an I-data channel 22I and a Q-data channel 22Q each with a dynamic range compressor stage and an operator stage and a dynamic range expander stage. Input stage 22 provides input data to the I and Q channels. The input stage acquires data carrying information expressed in values of vectors formed by in-phase (I) components, and quadrature-phase (Q) components. The I and Q input components can be thought of as representing the real and imaginary components of a complex number. Associated with this complex number is an angle and a magnitude defining a vector in the complex plane.

In FIG. 2, input stage 22 presents an I input signal to the I data channel, and a Q input signal to the Q data channel. The I input signal carries the I components, and the Q input signal carries the Q components. Stage 22 may be any suitable data acquisition device such as a wireless radio or a cellular telephone receiver with an input antenna 22A. The wireless signals are typically subject to variations in amplitude and frequency. The signal received by the input stage may be mixed with a local oscillator frequency to produce the I and Q components in the I and Q data channels. Alternatively, input stage 22 may be a simple amplifier for receiving I and Q components in separate I and Q data channels. The I and Q input data may come directly from data cable feed 22C or from a magnetic or optical data storage device 22S such as a disk drive, compact disc, or CD ROM.

The I dynamic range compressor 24I has a compressive nonlinear I transfer function, and is responsive to the I channel signal for compressing the amplitude dynamic range. Compressor 24I provides compressed I components in a compressed domain (shown in FIG. 2). We shall define the domain, as used herein, to be region of concern or function. The system involves several other domains as the term is used herein, namely, an input domain which may be linear (shown in FIG. 2), an expanded domain (also shown in FIG. 2), a logarithmic domain or approximate logarithmic domain (shown in FIG. 3), and a normalized domain (also shown in FIG. 3). The dynamic range of a signal at a point in the system, is the unitless ratio of the largest amplitude signal of interest at that point, divided by the smallest amplitude signal of interest at that point. Similarly, a Q dynamic range compressor 24Q has a compressive nonlinear Q transfer function, for compressing the amplitude dynamic range of the Q signal in the Q data channel to provide compressed Q components.

Compressive nonlinear transfer functions have an incremental gain which is a decreasing function of the amplitude of the input. For positive output values, compressive nonlinear transfer functions are concave functions with negative second derivatives. Examples of compressive nonlinear transfer functions include the inverse hyperbolic sine and for positive values, the square root function and the logarithm function.

An operator stage 26 operates on the compressed I and Q signals in the compressed domain for providing normalized components. Normalization in the broad sense drives the amplitude of some relationship between I and Q to a reference value having significance in a particular application. Classical normalization drives the quantity $I^2 + Q^2$ to a constant, nominally 1.

The operator stage includes F(i,q) function generator 26G in communication with I channel operator 26I and Q channel operator 26Q. The operating transfer function F(i,q) cross-links the I and Q data channels to effect the normalizing. Operator stage 26 employs the F(i,q) function to mathematically effect the compressed signals through the I and Q channel operators.

The embodiment of FIG. 2 shows only two data channels, in-phase I channel 22I and quadrature-phase Q channel 22Q. However, more than two information channels may be employed for more than two component phases. For example, three or four (or more) components may be extracted from the input signal and processed in three or four (or more) data channels. The additional components provide redundant information which increases the robustness of the processing. This robust polyphase information is less susceptible to implementation problems and to quantizing errors and rounding errors.

I data channel 22I and a Q data channel 22Q of system 20 each include a dynamic range expander stage. I dynamic range expander 28I has an expansive nonlinear I transfer function, and is responsive to the normalized compressed I components for expanding the amplitude dynamic range. Expander 28I provides expanded I components in an expanded domain (shown in FIG. 2). Similarly, Q dynamic range expander 28Q has an expansive nonlinear Q transfer function, for expanding the amplitude dynamic range of the Q signal in the Q data channel to provide expanded Q components.

Expansive nonlinear transfer functions have an incremental gain which is an increasing function of the amplitude of the input components. Examples of expansive nonlinear transfer functions include the hyperbolic sine, and for positive values, the exponential function.

The I compressive nonlinear transfer function and the Q compressive nonlinear transfer function may be the same (or effectively the same) compressive function. In theory these functions could be exactly the same. In practice, these functions may approximate ideal functions that yield effectively the same results as identical functions. Similarly, the I expansive nonlinear transfer function and the Q expansive nonlinear transfer function may also be effectively the same expansive function. In addition, the expansive nonlinear transfer function may be effectively the inverse of the compressive nonlinear transfer function.

Figure 4C:
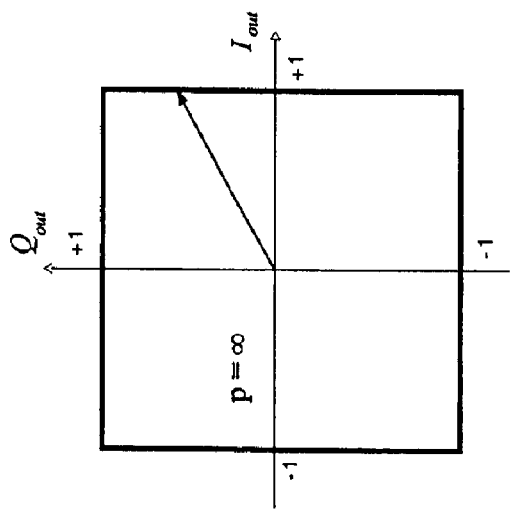
FIG. 4C is an Iout/Qout plot depicting the locus of points (square pattern) at the output of a p-normalizing system with p=infinity.

Expansion may be complementary to compression, canceling out the effect of the compression to provide a phase correct system. The complement to a logarithmic compressor is an antilogarithmic expander. The complement to a square root (or cube root) compressor is a squaring (or cubing) expander. In phase-correct systems, the IQ input angle (arctangent(Qin/Iin)) is the same as the IQ output angle (arctangent(Qout/Iout)). Phase-correct systems are particularly useful when the phase portion of the IQ information is employed. FIG. 4A shows the values of Iout and Qout that correspond to a vector whose $I_1$ norm (1-norm) is unity. The locus of points forms a symmetrical diamond pattern when the system is phase correct.

Figure 4B:
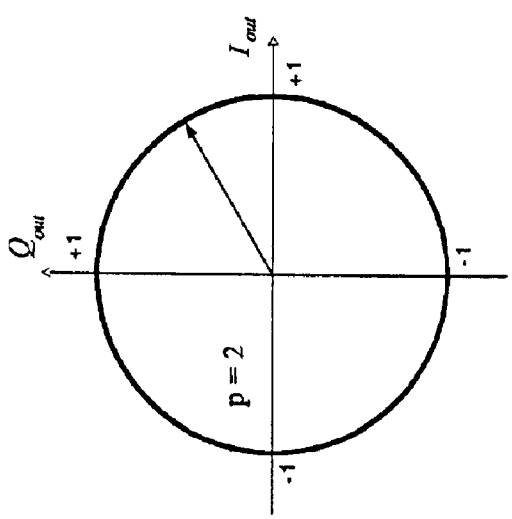
FIG. 4B is an Iout/Qout plot depicting the locus of points (circle pattern) at the output of a p-normalizing system with p=2.
Figure 4A:
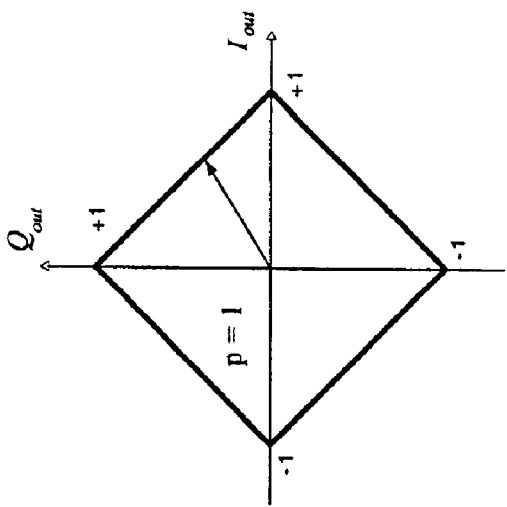
FIG. 4A is an Iout/Qout plot depicting the locus of points (diamond pattern) at the output of a p-normalizing system with p=1.

FIG. 4B shows the values of Iout and Qout that correspond to a vector whose $I_2$ norm (2-norm) is unity. The locus of points forms a symmetrical circle pattern when the system is phase correct. P may be a number larger than one or two. As p increases the locus of points converges toward a square pattern. The function Fn(i,q) may be the $I_\infty$ norm (infinity norm), which involves selecting the larger of the I or Q component magnitude values.

FIG. 4C shows the range of possible output values for the p=∞. As seen in FIG. 4C, the larger of Iout or Qout always has a magnitude equal to 1. All values represent an envelope of possible values of the vector consisting of the I and Q components, represented by a locus of vector endpoints. All values are phase correct when compression and expansion are complementary (i.e., are inverse functions relative to one another over a range of interest). At p=∞ (infinity), the maximum value, the locus pattern becomes a square (shown in FIG. 4C). The value p may assume non-integer positive values or values less than one. When p has a value of less than one, the function described above is, however, not a vector norm, although the terms may remain useful according to the invention. For the value p=infinity, the normalization corresponds to division by the larger (or largest in the case of more than two) of the component magnitudes.

Embodiments in which the compressive and expansive functions are not complementary are phase incorrect. Hence, a system without an expander stage produces a compressed output which is phase incorrect, but it still offers direct mapping between output and input. Thus, it is practical to provide systems without need for an expander stage so long as the value in the output can be found through direct mapping.

Figure 3:
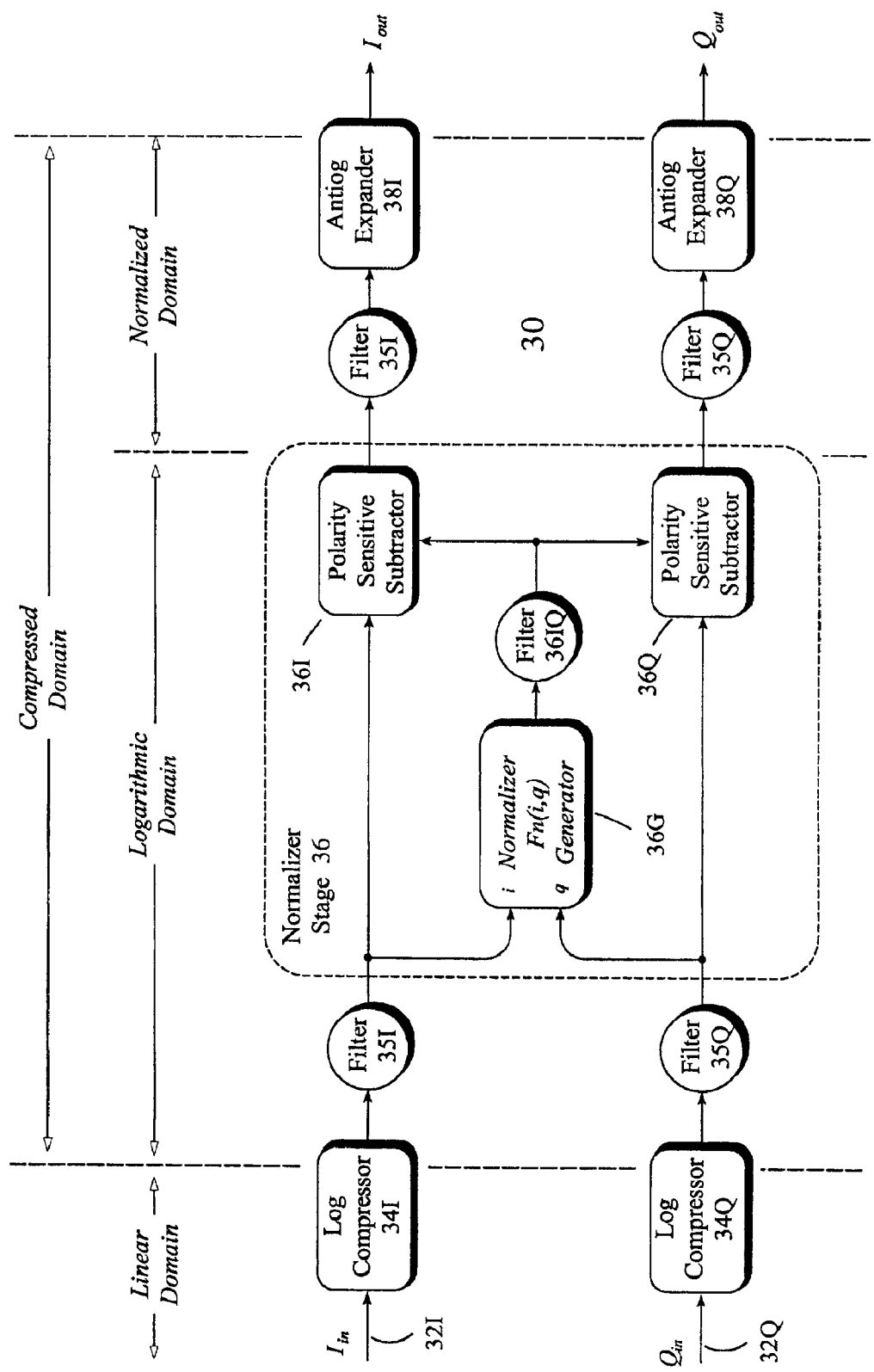
FIG. 3 is a block diagram of a specific embodiment of a system according to FIG. 2 employing logarithmic-based functions for processing phase and amplitude based IQ information.

Normalizer Embodiment (FIG. 3)

In system 30 (referring back to FIG. 3), the operator stage of FIG. 2, may be normalizer stage 36 containing normalizer function generator 36G. The operating function F(i,q) 26G may be a normalizing function Fn(i,q) from generator 36G. The normalizing function is used to provide normalized I and Q components (shown in FIG. 3).

The normalizing function Fn(i,q) may be a function used to generate a p-normalized vector of the input I and Q components 32I and 32Q, from the signals present at the outputs of Log Compressors 34I and 34Q, where "p" is a selected constant from "1" (one) to ∞ (infinity).

It should be appreciated that processing in general and normalizing specifically on the compressed I and Q components generally has a different effect than processing/normalizing on the input I and Q signals 22I and 22Q.

Understanding the difference in effect is critical to proper operation according to the invention. Otherwise, processing on a compressed signal will not correspond to processing on an uncompressed signal. To this end the following function may be incorporated into the F(i,q) function generator:

$$F(i, q) = \frac{1}{p}\log((\exp(|i_l|))^p + (\exp(|q_l|))^p), \quad (3)$$

where:

$$i_1 = sign(I)\log(1+k|I|) \text{ and} \quad (4)$$

$$q_1 = sign(Q)\log(1+k|Q|) \quad (5)$$

correspond to the outputs of the I compressors and Q compressors 24I and 24Q respectively. This is an example of providing processed compressed I-components and processed compressed Q-components that if passed through an invertible mapping have a constant vector norm. In practice the value of k is large so that, for the signal values of interest, the response of the logarithmic compressors are substantially logarithmic. For very small values of signals, the logarithmic compressors may have approximately linear response.

The normalizing function Fn(i,q) may be a function of the time history of the I and Q components, or the function Fn(i,q) maybe a memoryless function of the instantaneous values of the I and Q components. A memoryless function is independent of print values of the I and Q components, and responds instantly to the current values.

In a specific embodiment, the nonlinear compressive transfer functions may be logarithmic functions for transforming the I and Q components into a logarithmic domain. This permits normalization by a polarity sensitive subtraction operation. In this embodiment, the I and Q compressors may be I and Q logarithmic compressors 34I and 34Q. Furthermore, the I and Q expanders may be antilogarithmic expanders 38I and 38Q for maintaining the phase correctness of the output. The I and Q operators may be polarity sensitive subtracters 36I and 36Q (shown in FIG. 3) which subtract Fn(i,q) from the current values in the I and Q channels according to the following relationships:

$$i_s = (|i_1| - F(i,q)) \times sign(i_1) \quad (6)$$

$$q_s = (|q_1| - F(i,q)) \times sign(q_1) \quad (7)$$

The nonlinear compressive transfer functions may be transfer functions which approximate the logarithmic function. Nevertheless, such approximation functions may also permit normalization by subtraction.

I and Q expanders 38I and 38Q may provide polarity sensitive exponentiation of the approximately logarithmically compressed I and Q components in component data channels 32I and 32Q according to the following relationships:

$$I_{out} = \exp(|i_s|) \times sign(i_s) \quad (8)$$

$$Q_{out} = \exp(|q_s|) \times sign(q_s) \quad (9)$$

In a logarithmic inverse embodiment, the logarithmic compressive transfer functions are effectively the inverse hyperbolic sine function; and the expansive transfer functions are effectively the hyperbolic sine function. These hyperbolic functions cancel each other and maintain the phase correctness of the system.

Figure 5:
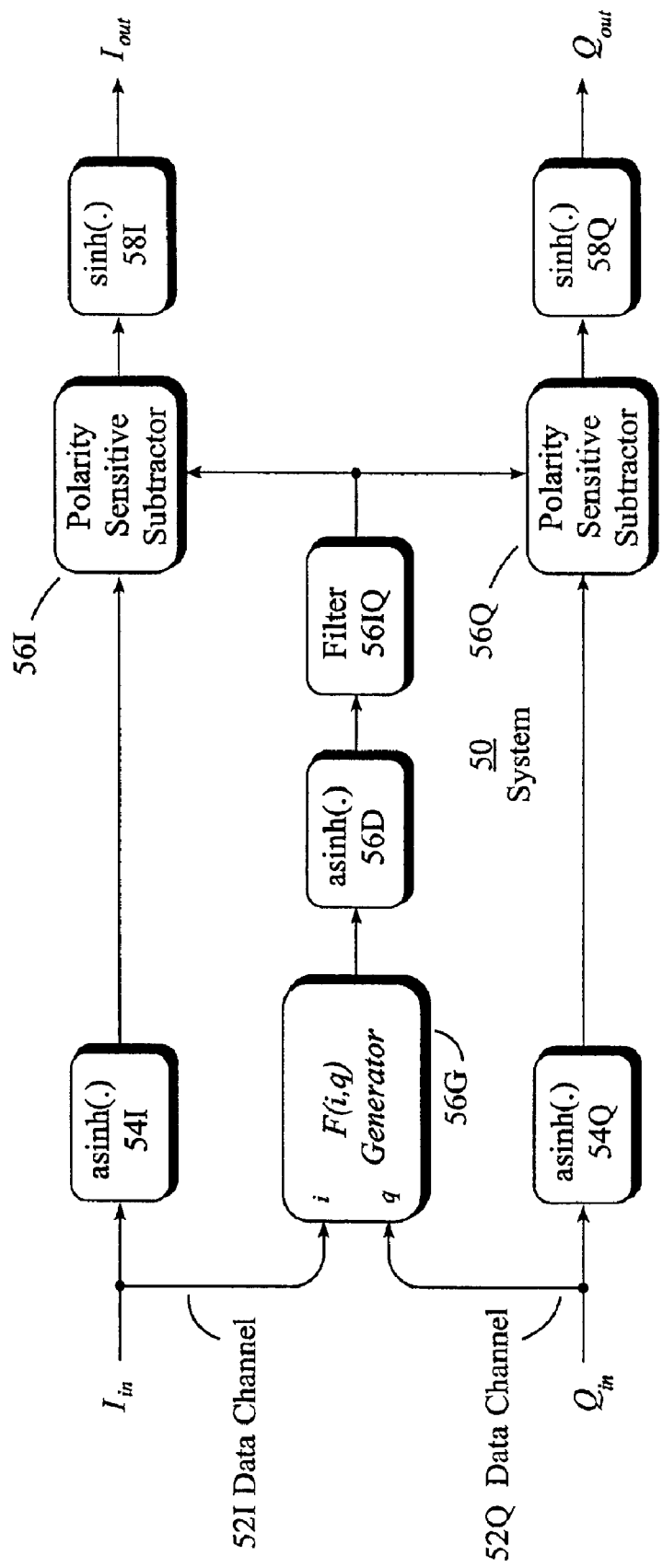
FIG. 5 is a block diagram of a specific embodiment of a system according to FIG. 2 employing hyperbolic sine-based functions for processing phase and amplitude based IQ information and amplitude based information which includes amplitude filtering and nonlinear processing.

Block Diagram (FIG. 5)

Referring to FIG. 5, the operation of an entire system is illustrated in the context of the use of hyperbolic compression and expansion functions. System 50 includes an I data channel 52I and a Q data channel 52Q each connected to a separate circuit whose output is the inverse hyperbolic singe (asinh) of the input, circuits 54I and 54Q respectively, and to a circuit which calculates the p-norm of the vector consisting of the I and Q components 56G. The output of the F(i,q) Generator 56G is passed through a circuit having an inverse hyperbolic sine response 56D. The output of the asinh circuit 56D is passed through a low-pass filter 56IQ and then subtracted from the output of the I and Q asinh amplifiers 54I and 54Q respectively using a polarity sensitive subtracter. (The filter 56IQ is useful to remove high-frequency signal information from the normalizing path, which preserves the desired amplitude information in the output signal.) The results of these subtractions are then passed through separate I and Q circuits, 58I and 58Q respectively, whose outputs are the hyperbolic sine of the inputs. Now the hyperbolic sine function can be expressed as:

$$\sinh(x) = \frac{e^x - e^{-x}}{2}. \quad (10)$$

For large positive values of x, the first term in the above expression dominates and the second term can be ignored. Similarly, for large negative values of x, the second term dominates and the first term can be ignored. Thus, $$\sinh^{-1}(x) \approx sign(x) \times log(1+2|x|) \text{ for } x >> 1. \quad (11)$$

Now for large values of x, $log(1+2|x|) \approx log(2|x|)$. This corresponds to k=2. Then the subtraction of the log of the norm followed by passing the result of this subtraction through a circuit with a hyperbolic sine response corresponds to dividing each of the I and Q signals by the norm of the vector formed by the I and Q components of the input signal.

The approach described in connection with FIG. 5 is amenable to signal constellations having non-constant envelope or amplitude. In order for this system to provide the correct response, the absolute value of x must be large compared to 1. The units of x are chosen such that for all signal levels of interest, the absolute value of x is large compared to one. This corresponds to choosing a large value of k above in equations (4) and (5).

Expanded Domain Filters (FIG. 2)

I and Q expanded domain filters 29I and 29Q (shown in FIG. 2) positioned in data channels 22I and 22Q, are responsive to the I and Q expander stages. These filters are frequency selective (typically bandpass-type with an equalizing characteristic) and reduce energy in the expanded I and Q signals at selected undesired frequencies. I and Q expanded domain filters may alternatively be low-pass filters for reducing high frequency input and additive noise in the expanded I and Q signals. Additive noise is often high frequency noise generated within the system from active circuit elements. This noise is tolerated during the processing because the system employs a wider bandwidth than the IQ information.

Compressed Domain Filters (FIG. 3)

Compressed domain filters 35I and 35Q (shown in FIG. 3) positioned in data channels 32I and 32Q filter the compressed I and Q signals. The filters are frequency responsive for changing the complex amplitude of components of the compressed I and Q signals at selected frequencies. Certain frequencies included in the compressed I and Q signals may not form part of the desired I and Q information, and may be reduced by these filters. The filters may be positioned somewhere in the compressed domain, either before or after the operator stage, as indicated by the two circles labeled 35I and the two circles labeled 35Q. In one embodiment, I and Q compressed domain filters may be high-pass filters for reducing slow variations in the compressed I and Q signals. Such low frequency amplitude variation typically result from inconsistencies in the transmission and/or reception path.

Alternatively, the compressed domain filter may be filter 26IQ shown in FIG. 2 (and 36IQ shown in FIG. 3) located in the operator stage immediately after function generator 26G (and 36G) as indicated by the circle labeled 26IQ (and 36IQ). This filter may be low pass to reduce higher frequencies containing information components while preserving lower frequencies containing the slow changing undesired frequencies or noise so it can be used for cancellation. The filtered noise is reintroduced by division (or inverse multiplication) into the component channels during normalization for reducing the low frequency content of the I and Q outputs.

Method of Processing

The steps of the general method of processing IQ information are described below. The apparatus required for carrying out the above method of processing is disclosed in FIGS. 2 and 3 and in the related detailed descriptions.

Receiving I and Q input signals in the I and Q channels.

Compressing the amplitude dynamic range of the I signal with a compressive nonlinear I transfer function.

Compressing the amplitude dynamic range of the Q signal with a compressive nonlinear Q transfer function.

Operating on the compressed signals with an operating function F(i,q) for providing normalized compressed I and Q components. The operating step may be a normalizing step in which the compressed I and Q signals are divided by a normalizing function Fn(i,q) to provide normalized compressed I and Q components. Frequency selective filtering of the compressed I and Q signals may be used in the compressed domain, to change the amplitude of the compressed I and Q signals at selected frequencies.

The compressed domain filtering step may occur before or after the normalizing step. The frequency selective filtering may be high pass filtering to reduce slow variations in the compressed I and Q signals. The filtering step may occur during the normalizing through a frequency selective characteristic of the function F(i,q).

The function F(i,q) may have a time history relationship with the I and Q components and be a function of past values and/or current values and/or subsequent values of the components. Alternatively, the function F(i,q) may be a memoryless function.

Expanding the amplitude dynamic range of the compressed operated I signal after the operating step, with an expansive nonlinear I transfer function.

Expanding the amplitude dynamic range of the compressed operated Q signal with an expansive nonlinear Q transfer function.

The compressive transfer functions may be effectively the same compressive function. The step of compressing the I signal and the step of compressing the Q signal may occur simultaneously in separate channels. Similarly, the expansive transfer functions may be effectively the same expansive function. The step of expanding the I signal and the step of expanding the Q signal may occur simultaneously. During the expanding step, the expanding exponentiation provides the polarity sensitive antilogarithm of the logarithmically compressed I and Q components. In this antilog embodiment of the method, the compressive transfer function and the expanding exponentiation have the same base. However in a non-antilog embodiment, the compressive transfer function and the expanding exponentiation may not have the same base.

Frequency selective filtering of the expanded I and Q signals may be done after the expanding step, in order to reduce energy in the I and Q signals at selected frequencies. This filtering step may be low pass filtering.

CONCLUSION

Various changes may be made in the structure and embodiments shown herein without departing from the concept of the invention. Further, features of the embodiments shown in the various figures may be employed with the embodiments shown in the other figures. Therefore, the scope of the invention is to be determined by the terminology of the following claims and the legal equivalents thereof.

What is claimed is:

1. An apparatus for manipulating an analog signal containing information contained in at least a first channel in the form of first-channel input components and contained in a second channel in the form of second-channel input components, said analog signals being subject to variations in amplitude, said apparatus comprising:
   a first dynamic range compressor operative according to a first compressive nonlinear transfer function and responsive to input to the first-channel for compressing the amplitude dynamic range of a first-channel-signal in the first channel to provide compressed first-channel components;
   a second dynamic range compressor operative according to a second compressive nonlinear transfer function and responsive to input to the second-channel for compressing the amplitude dynamic range of a second-channel-signal in the second channel to provide compressed second-channel components; and
   a signal processing element operative according to a transfer function F(i,q) for operating on said compressed first-channel components and said compressed second-channel components for providing, if expanded, first-channel output components and second-channel output components that have a constant vector norm.

2. The apparatus of claim 1, further comprising further input channels for further channel components.

3. The apparatus according to claim 1 wherein said first-channel signals are related with said second-channel signals and said signal processing element is operative to enforce normalization of said first-channel component and said second-channel component.

4. An apparatus for manipulating an analog signal containing information contained in an in-phase channel (I-channel) for in-phase (I) components and in a quadrature-phase channel (Q-channel) for quadrature-phase (Q) components, said apparatus comprising:
   an input element having an I-channel and a Q-channel for receiving an I-input signal and a Q-input signal, said input signals being subject to variations in amplitude;
   a first dynamic range compressor operative according to a first compressive nonlinear transfer function and responsive to the I-channel input for compressing the amplitude dynamic range of the I-signal in the I-channel to provide compressed I-components;
   a second dynamic range compressor operative according to a second compressive nonlinear transfer function and responsive to the Q-channel input for compressing the amplitude dynamic range of the Q-signal in the Q-channel to provide compressed Q-components; and
   a signal processing element operative according to a transfer function F(i,q) for operating on said compressed I-components and said compressed Q-components for providing processed compressed I-components and processed compressed Q-components that if passed through an invertible mapping have a constant vector norm.

5. The apparatus of claim 4, further comprising I and Q filters for filtering the compressed I and Q signals, to change the amplitude of the compressed I and Q signals at selected frequencies.

6. The apparatus of claim 4, wherein a filter is positioned at the output of the operating function F(i,q).

7. The apparatus of claim 5, wherein said I and Q filters are high-pass filters for reducing slow variations in the compressed I and Q signals.

8. The apparatus of claim 4, wherein the function F(i,q) enforces a p-normalization of the I and Q components, where "p" is a selected constant.

9. The apparatus of claim 8, wherein p is approximately 1.

10. The apparatus of claim 8, wherein p is approximately 2.

11. The apparatus of claim 8, wherein p is greater than 2.

12. The apparatus of claim 8, wherein the function F(i,q) is the $I_\infty$ norm, which involves selecting the larger of I component magnitude values or Q component magnitude values.

13. The apparatus of claim 4, wherein the function F(i,q) of the normalizer includes the time history of the I and Q components.

14. The apparatus of claim 4, wherein the function F(i,q) of the normalizer is a memoryless function of the instantaneous values of the I and Q components.

15. The apparatus of claim 4, further comprising:
   an I dynamic range expander having an expansive nonlinear I transfer function and responsive to the compressed I components from the operator for expanding the amplitude dynamic range of the compressed I signal in the I channel, to provide expanded I components; and
   a Q dynamic range expander having an expansive nonlinear Q transfer function, and responsive to the compressed Q components from the operator for expanding the amplitude dynamic range of the compressed Q signal in the Q channel, to provide expanded Q components.

16. The apparatus of claim 15, wherein:
   the I compressive nonlinear transfer function and the Q compressive nonlinear transfer function are effectively the same compressive function; and
   the I expansive nonlinear transfer function and the Q expansive nonlinear transfer function are effectively the same expansive function.

17. The apparatus of claim 16, wherein the expansive nonlinear transfer function is effectively proportional to the inverse of the compressive nonlinear transfer function.

18. The apparatus of claim 15, wherein the operator effects a normalization of the I and Q components.

19. The apparatus of claim 18, wherein the nonlinear compressive transfer functions are logarithmic transfer functions permitting normalization by subtraction.

20. The apparatus of claim 18, wherein the nonlinear compressive transfer functions are approximately logarithmic transfer functions.

21. The apparatus of claim 20, wherein the use of approximately logarithmic transfer functions permits normalization by subtraction.

22. The apparatus of claim 20, wherein the I and Q expanders provide exponentiation of the approximately logarithmically compressed, normalized I and Q components.

23. The apparatus of claim 18, wherein the compressive nonlinear transfer functions are effectively the inverse hyperbolic sine function, and/or the expansive nonlinear transfer functions are effectively the hyperbolic sine function.

24. The apparatus claim 15, further comprising I and Q filters responsive to the I and Q expanders for filtering the expanded I and Q signals, to reduce energy in the expanded I and Q signals at selected frequencies.

25. The apparatus of claim 24, wherein said I and Q filters are low pass filters.

26. A method for manipulating an analog signal containing information contained in at least a first channel on the form of first-channel input components and contained in a second channel in the form of second-channel components, said analog signals being subject to variations in amplitude, said method comprising:

compressing, according to a first compressive nonlinear transfer function and responsive to the first-channel input, the amplitude dynamic range of a first-channel-signal in the first channel to provide compressed first-channel components;

compressing, according to a second compressive nonlinear transfer function and responsive to the second-channel input, the amplitude dynamic range of a second-channel-signal in the second channel to provide compressed second-channel components; and operating, according to a transfer function F(i,q), on said compressed first-channel components and said compressed second-channel components for providing, if expanded, first-channel output components and second-channel output components that have a constant vector norm.

27. The method of claim 26, further comprising further input channels for further component channels.

28. The method according to claim 26 wherein said first-channel signals are related with said second-channel signals and said operating step enforces normalization of said first-channel component and said second-channel component.

29. The method of claim 28, wherein the function F(i,q) is a memoryless functions of the instantaneous values of the I and Q components.

30. The method of claim 27, wherein after the operating step, the method further comprises the additional steps of:

expanding the amplitude dynamic range of the compressed, normalized I-components with an expansive nonlinear I transfer function; and expanding the amplitude dynamic range of the compressed, normalized Q-components with an expansive nonlinear Q transfer function.

31. The method of claim 30 wherein:

the I compressive nonlinear transfer function and the Q compressive nonlinear transfer function are effectively the same compressive function; and the I expansive nonlinear transfer function and the Q expansive nonlinear transfer function are effectively the same expansive function.

32. The method of claim 31 wherein the expansive nonlinear transfer function is effectively proportional to the inverse of the compressive nonlinear transfer function.

33. The method of claim 30 wherein operating comprises:

normalizing by dividing the compressed I-components and Q-components with the function F(i,q) for providing normalized I and Q components.

34. The method of claim 33, wherein:

the compressive nonlinear transfer function is logarithmic transfer function permitting normalization by subtraction.

35. The method of claim 33, wherein:

the compressive nonlinear transfer function is effectively the inverse hyperbolic sine function and/or the expansive nonlinear transfer function is effectively the hyperbolic sine function.

36. The method of claim 33, wherein:

the compressive nonlinear transfer function is an approximately logarithmic transfer function.

37. The method of claim 36 wherein the expanding step provides exponentiation of the approximately logarithmically compressed, normalized I and Q components.

38. The method of claim 37 wherein during the expanding step, the expanding exponentiation provides the antilogarithms of the approximately logarithmically compressed I and Q components.

39. The method of claim 37 wherein the compressive transfer function and the expanding exponentiation have the same base.

40. The method of claim 37 wherein the compressive transfer function and the expanding exponentiation do not have the same base.

41. The method of claim 30 wherein after the expanding step, further comprising the additional step of:

frequency selective filtering the expanded I-components and Q-components, in order to reduce energy in the I-components and Q-components signals at selected frequencies.

42. The method of claim 41 wherein the frequency selective filtering step is low pass filtering.

43. A method for manipulating an analog signal containing information contained an in-phase channel (I-channel) for in-phase (I) components and in a quadrature-phase channel (Q-channel) for quadrature-phase (Q) components, said method comprising:

receiving an input signal in the I-channel and the Q-channel for receiving an I-input signal and a Q-input signal, said input signals being subject to variations in amplitude;

compressing, according to a first compressive nonlinear transfer function, the amplitude dynamic range of the I-signal in the I-channel to provide compressed I-components;

compressing, according to a second compressive nonlinear transfer function, the amplitude dynamic range of the Q-signal in the Q-channel to provide compressed Q-components; and operating on said compressed I-components and said compressed Q-components according to a transfer function F(i,q) for providing processed compressed I-components and processed compressed Q-components that if passed through an invertible mapping have a constant vector norm.

44. The method of claim 43, further comprising the additional step of frequency-selective filtering the compressed I and Q signals, to change the amplitude of the compressed I and Q signals at selected frequencies.

45. The method of claim 44, wherein the normalizing step is responsive to values output by the filtering step.

46. The method of claim 44, wherein the filtering step is responsive to values output by the normalizing step.

47. The method of claim 44, wherein the filtering step is responsive to the values output by the transfer function F(i,q) in the operating step.

48. The method of claim 44, wherein the frequency selective filtering step is high pass filtering to reduce slow variations in the compressed I and Q signals.

49. The method of claim 43, wherein the function F(i,q) is a function of past values and/or current values and/or subsequent values of the I and Q components.

50. The method of claim 43, wherein the function F(i,q) is a function of the time history of the I and Q components.

51. Apparatus for manipulating an analog signal containing information expressed in values of vectors formed by in-phase (I) components in an I channel, and quadrature-phase (Q) components in a Q channel, comprising:

an input means having an I channel and a Q channel for receiving an I input signal in the I channel carrying the I components, and a Q input signal in the Q channel carrying the Q components, which input signals are subject to variations in amplitude and frequency content;

a first dynamic range compressor operative according to a first compressive nonlinear transfer function and responsive to the I-channel input for compressing the amplitude dynamic range of the I-signal in the I-channel to provide compressed I-components;

a second dynamic range compressor operative according to a second compressive nonlinear transfer function and responsive to the Q-channel input for compressing the amplitude dynamic range of the Q-signal in the Q-channel to provide compressed Q-components; and an operator means having an operating transfer function F(i,q) for mathematically operating on said compressed I and Q components for providing normalized I and Q components.

52. The apparatus of claim 51, further comprising more than two input channels for more than two component phases.

53. The apparatus of claim 51, further comprising I and Q filters for filtering the normalized I and Q signals, to change the amplitude of the I and Q signals at selected frequencies.

54. The apparatus of claim 53, wherein the I and Q filters are formed in a single filter positioned within the operator immediately after the operating function F(i,q).

55. The apparatus of claim 53, wherein I and Q filters are high pass filters for reducing slow variations in the compressed I and Q signals.

56. The apparatus of claim 51, wherein the function F(i,q) effects a p-normalization of the I and Q components, where "p" is a selected constant.

57. The apparatus of claim 56, wherein p is approximately 1.

58. The apparatus of claim 56, wherein p is approximately 2.

59. The apparatus of claim 56, wherein p is greater than 2.

60. The apparatus of claim 56, wherein the function F(i,q) is the $I_\infty$ norm, which involves selecting the larger of I component magnitude values or Q component magnitude values.

61. The apparatus of claim 51, wherein the function F(i,q) of the normalizer is a function of the time history of the I and Q components.

62. The apparatus of claim 51, wherein the function F(i,q) of the normalizer is a memoryless function of the instantaneous values of the I and Q components.

* * * * *